United States Patent
Alzate Vinasco et al.

(10) Patent No.: US 11,462,541 B2
(45) Date of Patent: Oct. 4, 2022

(54) MEMORY CELLS BASED ON VERTICAL THIN-FILM TRANSISTORS

(71) Applicant: Intel Corporation, Santa Clara, CA (US)

(72) Inventors: Juan G. Alzate Vinasco, Tigard, OR (US); Abhishek A. Sharma, Hillsboro, OR (US); Fatih Hamzaoglu, Portland, OR (US); Bernhard Sell, Portland, OR (US); Pei-Hua Wang, Beaverton, OR (US); Van H. Le, Portland, OR (US); Jack T. Kavalieros, Portland, OR (US); Tahir Ghani, Portland, OR (US); Chieh-Jen Ku, Hillsboro, OR (US); Travis W. Lajoie, Forest Grove, OR (US); Umut Arslan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 779 days.

(21) Appl. No.: 16/222,934

(22) Filed: Dec. 17, 2018

(65) Prior Publication Data
US 2020/0194434 A1 Jun. 18, 2020

(51) Int. Cl.
| H01L 21/00 | (2006.01) |
| H01L 27/108 | (2006.01) |
| H01L 29/786 | (2006.01) |
| H01L 49/02 | (2006.01) |
| H01L 29/66 | (2006.01) |
| H01L 29/49 | (2006.01) |
| H01L 29/417 | (2006.01) |

(52) U.S. Cl.
CPC .... *H01L 27/10805* (2013.01); *H01L 27/1085* (2013.01); *H01L 27/10873* (2013.01); *H01L 28/60* (2013.01); *H01L 29/41741* (2013.01); *H01L 29/4908* (2013.01); *H01L 29/66742* (2013.01); *H01L 29/78642* (2013.01)

(58) Field of Classification Search
CPC .......... H01L 27/10805; H01L 27/1085; H01L 27/10873; H01L 28/50; H01L 29/41741; H01L 29/4908; H01L 29/66742; H01L 29/78642
See application file for complete search history.

(56) References Cited

U.S. PATENT DOCUMENTS

| 11,245,038 B2 * | 2/2022 | Wang | H01L 27/10823 |
| 11,335,789 B2 * | 5/2022 | Sharma | H01L 29/42356 |
| 2021/0028176 A1 * | 1/2021 | Derner | H01L 27/10841 |

* cited by examiner

*Primary Examiner* — Richard A Booth
(74) *Attorney, Agent, or Firm* — Schwabe, Williamson & Wyatt P.C.

(57) ABSTRACT

Embodiments herein describe techniques for a semiconductor device including a substrate oriented in a horizontal direction, and a memory cell including a transistor and a capacitor above the substrate. The transistor includes a gate electrode oriented in a vertical direction substantially orthogonal to the horizontal direction, and a channel layer oriented in the vertical direction, around the gate electrode and separated by a gate dielectric layer from the gate electrode. The capacitor is within an inter-level dielectric layer above the substrate. The capacitor includes a first plate coupled with a second portion of the channel layer of the transistor, and a second plate separated from the first plate by a capacitor dielectric layer. The first plate of the capacitor is also a source electrode of the transistor. Other embodiments may be described and/or claimed.

21 Claims, 9 Drawing Sheets

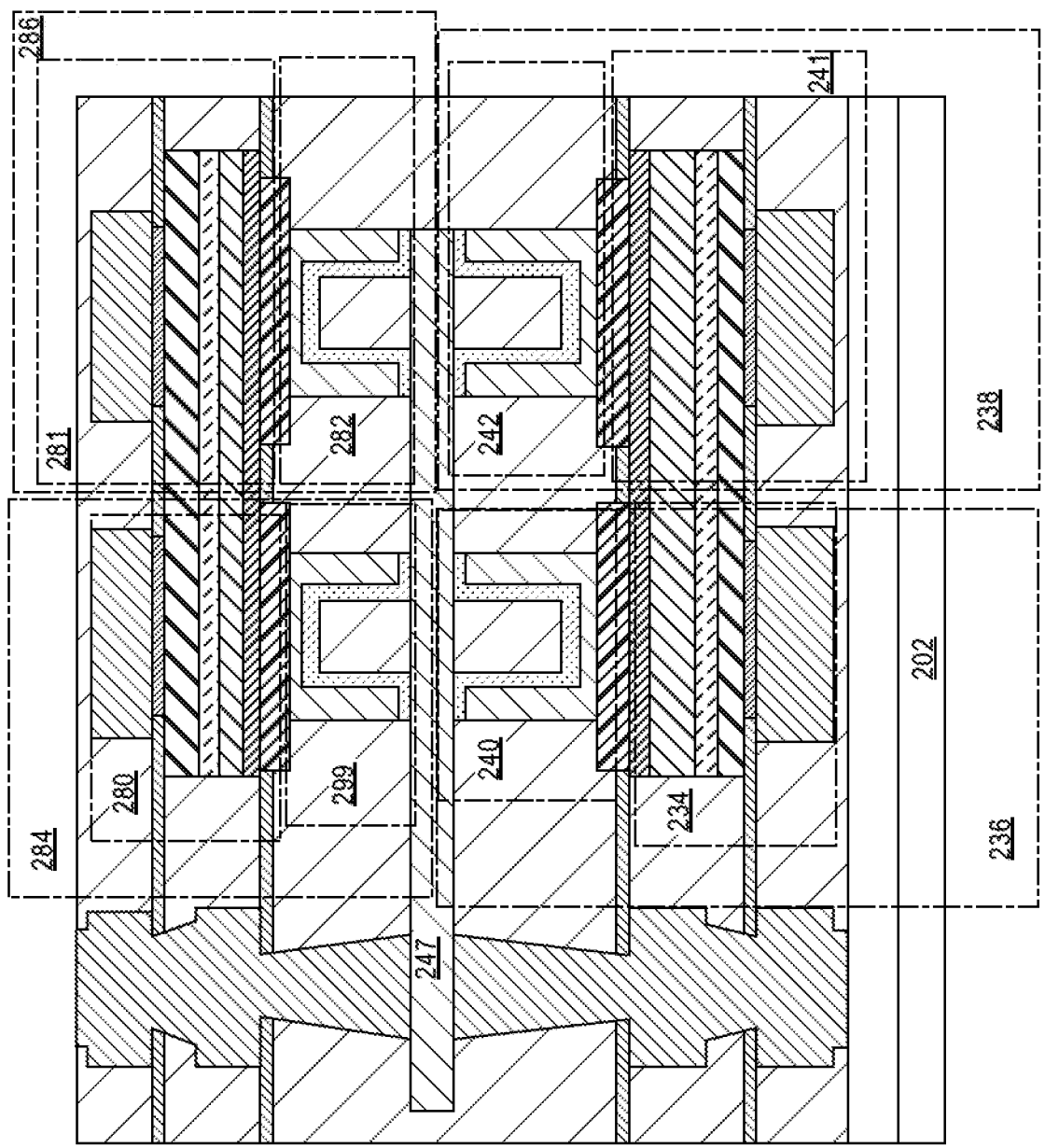

MEMORY CELLS BASED ON VERTICAL THIN-FILM TRANSISTORS

FIELD

Embodiments of the present disclosure generally relate to the field of integrated circuits, and more particularly, to memory arrays.

BACKGROUND

Memory devices are important parts of integrated circuits (IC) and modern electronic devices. A memory device, e.g., a dynamic random access memory (DRAM) array, may include a plurality of memory cells, where a memory cell may include a selector, e.g., a transistor, to control the access to a storage cell. When a silicon transistor is used as a selector, the silicon transistor may be very leaky, which may bring adverse impact to the performance of the storage cell. A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs in the back-end, while leaving the silicon substrate areas for high-speed transistors. A TFT may be used as a selector for a memory cell in a memory device, e.g., a DRAM device. However, current designs and implementations of memory devices, e.g., DRAM devices, still face many challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 2(a)-2(b) schematically illustrate diagrams of a semiconductor device including multiple stacked memory cells having vertical TFTs and capacitors, in accordance with some embodiments.

DETAILED DESCRIPTION

Figure 1A:
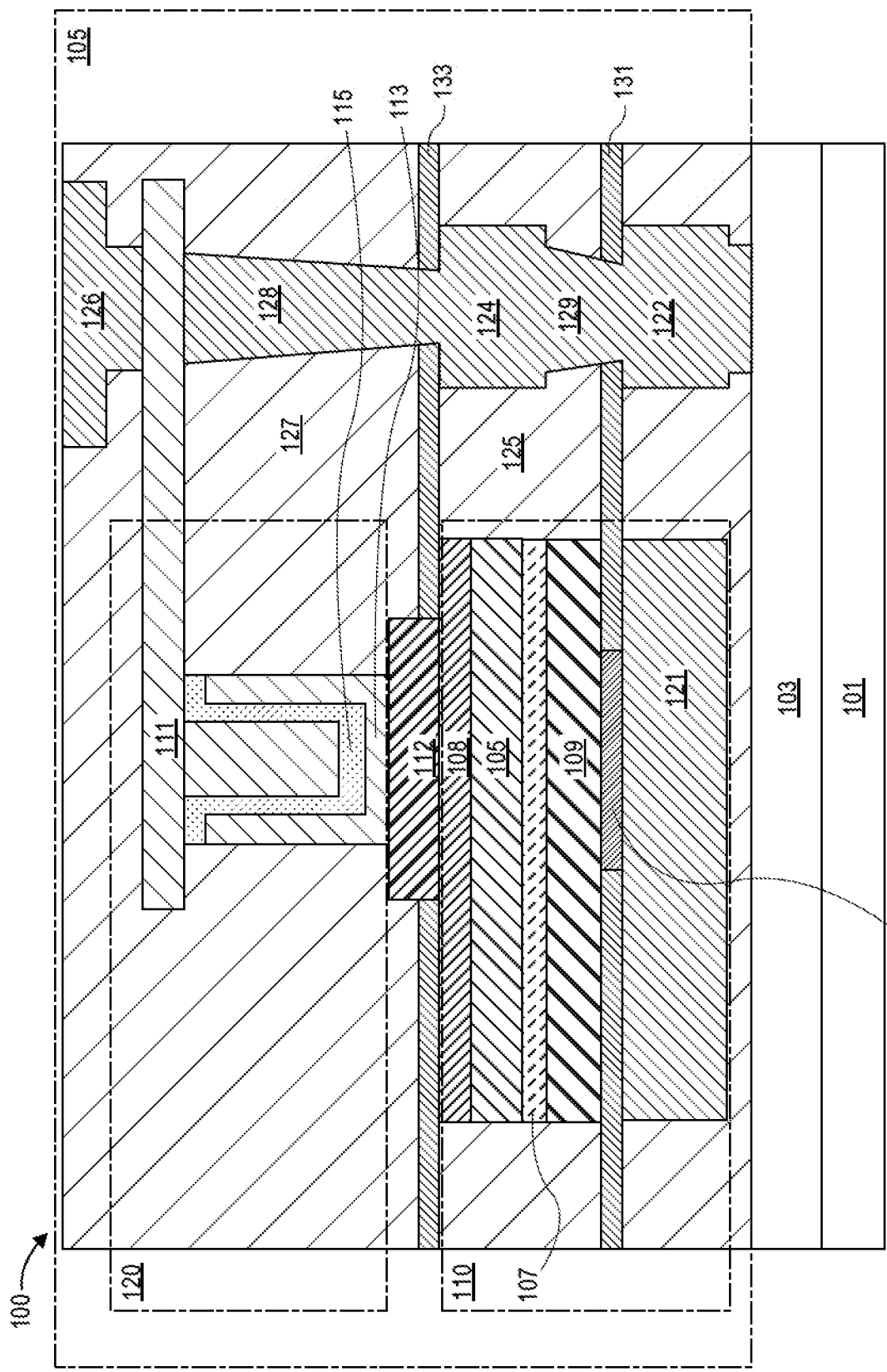
FIGS. 1(a)-1(c) schematically illustrate diagrams of memory cells including a vertical thin-film transistor (TFT) and a capacitor formed in back-end-of-line (BEOL) on a substrate, in accordance with some embodiments.

Memory devices are important parts of integrated circuits (IC) and modern electronic devices. High density or high bandwidth memory devices may be particularly useful for many applications, e.g., graphics, artificial intelligence, machine learning, or compute in or near memory. Dynamic random access memory (DRAM), or an enhanced or embedded dynamic random access memory (eDRAM), may be one of the leading candidates for high density or high bandwidth memory devices. A memory array, e.g., a DRAM or an eDRAM, may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell.

Memory devices may be implemented with deep trench capacitors, or capacitor over bit (COB). However, such implementations of memory devices may still occupy considerable area due to spatial or volume requirements of the capacitors. In addition, a DRAM or an eDRAM device may have challenges to be embedded into fast logic processing circuits. In some cases, DRAM density may be improved by planar scaling, or stacked planar thin-film transistors (TFT). However, scaling planar TFTs may be limited by the minimal features in fabrication.

Embodiments herein may present a memory device including memory cells with vertical TFTs. With vertical TFTs, an area size of a memory cell may be reduced to be $4F^2$, where F is the critical dimension of the node. Memory devices including memory cells with vertical TFTs may allow high capacity compatible with appropriate logic to achieve large bandwidth. In addition, by further stacking vertical TFT arrays on top of each other, more sharing and savings may be achieved, e.g., sharing sense amplifiers that select between the stacked arrays during read out of the contents saved in the memory cells. Furthermore, stacked vertical TFT arrays may achieve densities of $4F^2/N$ for a memory cell, where N is the number of stacked arrays.

Embodiments herein may present a semiconductor device including a substrate oriented in a horizontal direction, and a memory cell including a transistor and a capacitor above the substrate. The transistor includes a gate electrode above the substrate, oriented in a vertical direction substantially orthogonal to the horizontal direction. The transistor further includes a channel layer oriented in the vertical direction, around the gate electrode and separated by a gate dielectric layer from the gate electrode. In addition, the transistor includes a drain electrode separated from the gate electrode, and in contact with a first portion of the channel layer. The capacitor is within an ILD layer above the substrate. In detail, the capacitor includes a first plate coupled with a second portion of the channel layer of the transistor, and a second plate separated from the first plate by a capacitor dielectric layer. The drain electrode is located at a first side of the channel layer, and the first plate of the capacitor is located at a second side of the channel layer opposite to the first side of the channel layer. The first plate of the capacitor is also a source electrode of the transistor.

Embodiments herein may present a method for forming a semiconductor device. The method may include: forming a first metal electrode located in a first metal layer above a substrate as a drain electrode for a transistor, where the substrate is oriented in a horizontal direction. The method includes forming a channel layer of the transistor oriented in a vertical direction substantially orthogonal to the horizontal direction, where the channel layer is coupled to the first metal electrode at a first portion located at a first side of the channel layer. The method further includes forming a gate electrode surrounded by the channel layer, oriented in the vertical direction. The gate electrode includes a second metal electrode located in a second metal layer, and the second metal layer is separated from the first metal layer by a first ILD layer. Moreover, the method includes forming a first plate of a capacitor above the second metal layer, within a second ILD layer, and coupled with a second portion of the channel layer located at a second side of the channel layer opposite to the first side of the channel layer. The first plate of the capacitor is also a source electrode of the transistor. Furthermore, the method includes forming a second plate of the capacitor within the second ILD layer, and separated from the first plate by a capacitor dielectric layer, where the transistor and the capacitor form a memory cell.

Embodiments herein may present a computing device, which may include a circuit board, and a memory device coupled to the circuit board and including a memory array. In more detail, the memory array may include a plurality of memory cells. A memory cell of the plurality of memory cells includes a substrate oriented in a horizontal direction, a transistor and a capacitor above the substrate. The transistor includes a gate electrode above the substrate, oriented in a vertical direction substantially orthogonal to the horizontal direction. The transistor further includes a channel layer oriented in the vertical direction, around the gate electrode and separated by a gate dielectric layer from the gate electrode. In addition, the transistor includes a drain electrode separated from the gate electrode, and in contact with a first portion of the channel layer. The capacitor is within an inter-level dielectric (ILD) layer above the substrate. In detail, the capacitor includes a first plate coupled with a second portion of the channel layer of the transistor, and a second plate separated from the first plate by a capacitor dielectric layer. The drain electrode is located at a first side of the channel layer, and the first plate of the capacitor is located at a second side of the channel layer opposite to the first side of the channel layer. The first plate of the capacitor is also a source electrode of the transistor.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A TFT is a kind of field-effect transistor formed at BEOL and including a channel layer, a gate electrode, and source and drain electrodes, over a supporting but non-conducting substrate.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
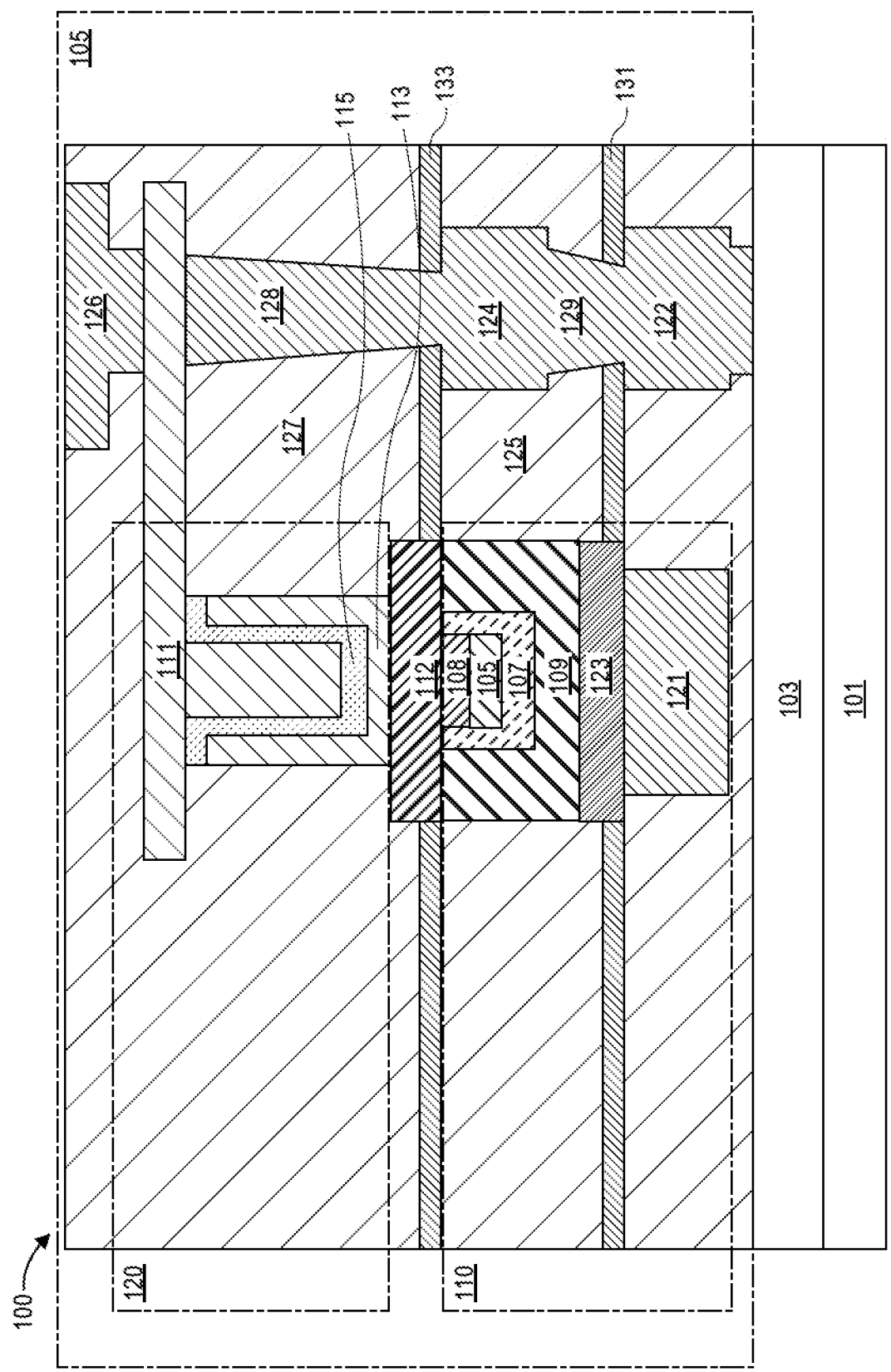
Figure 1C:
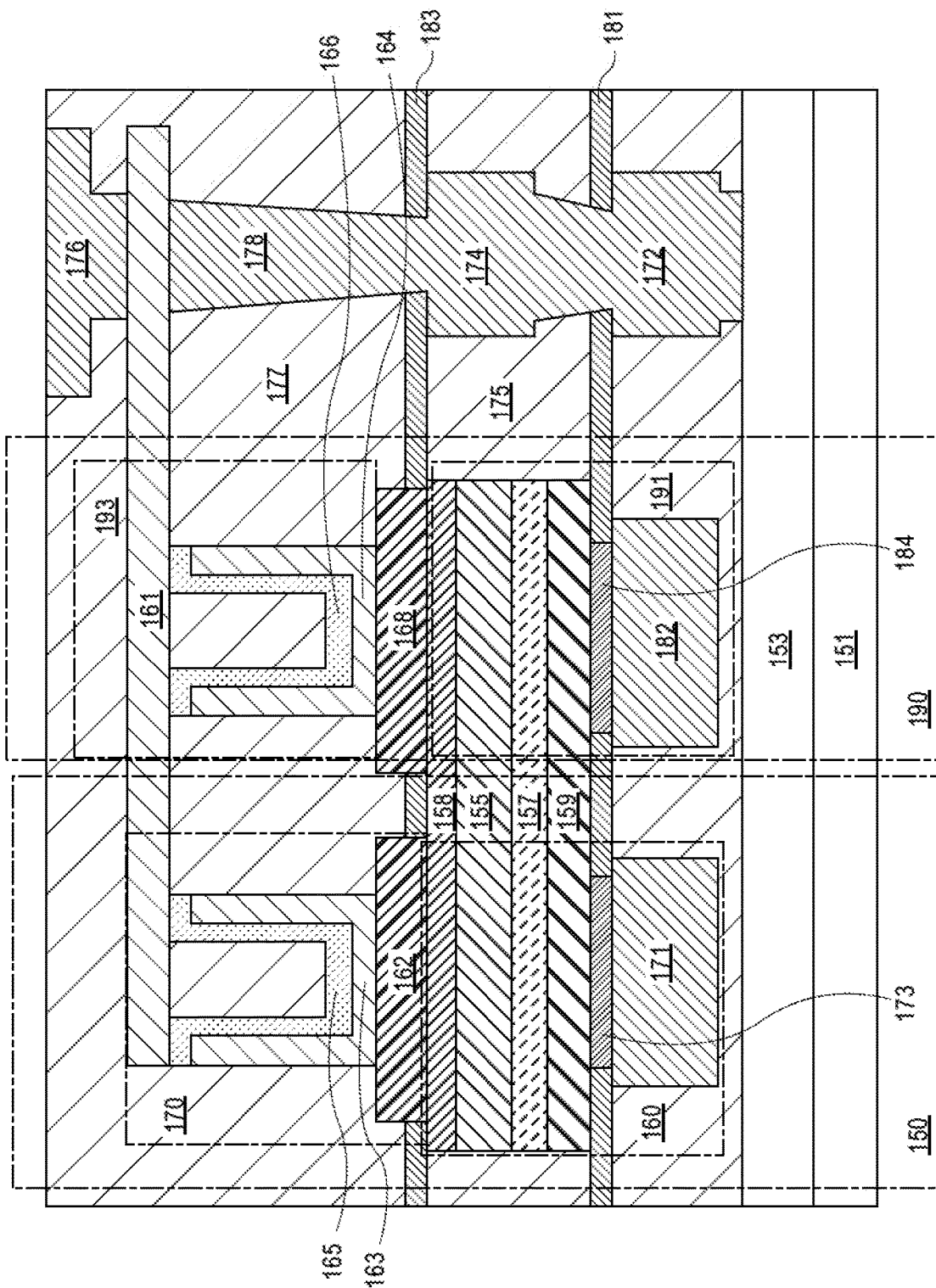

FIGS. 1(a)-1(c) schematically illustrate diagrams of memory cells including a vertical TFT and a capacitor formed in BEOL on a substrate, in accordance with some embodiments. For example, a memory cell 100 includes a vertical TFT 110 and a capacitor 120 formed in BEOL on a substrate 101. For clarity, features of the memory cell 100, the vertical TFT 110, the capacitor 120, and the substrate 101, may be described below as examples for understanding an example memory cell including a vertical TFT and a capacitor formed in BEOL on a substrate. Further, it is to be understood that one or more of the components within a memory cell, a vertical TFT, a capacitor, or a substrate, may include additional and/or varying features from the description below, and may include any device that one having ordinary skill in the art would consider and/or refer to as a memory cell, a vertical TFT, a capacitor, or a substrate.

In embodiments, as shown in FIGS. 1(a)-1(b), the memory cell 100 includes the vertical TFT 110 and the capacitor 120 within an interconnect structure including various metal layers and ILD layers above the substrate 101. The memory cell 100 may be a memory cell of a memory array. FIG. 1(a) shows the memory cell 100 in a wordline direction of the memory array, while FIG. 1(b) shows the memory cell 100 in a bitline direction substantially orthogonal to the wordline direction.

In detail, the memory cell 100 includes substrate 101, an ILD layer 103 above the substrate 101, an ILD layer 125 above the ILD layer 103, and an ILD layer 127 above the ILD layer 125. A metal layer 122, a metal layer 124, and a metal layer 126 are above the substrate 101, and separated by the ILD layers, e.g., the ILD layer 125, and the ILD layer 127. The ILD layer 103, the ILD layer 125, the ILD layer 127, the metal layer 122, the metal layer 124, and the metal layer 126 may be a part of an interconnect structure at BEOL 105 on the substrate 101. Various metal electrode may be formed within the metal layers. An etching stop layer may be adjacent to a metal layer. For example, an etching stop layer 131 is adjacent to the metal layer 122, and an etching stop layer 133 is adjacent to the metal layer 124. A short via, e.g., a short via 123, may be within or within or through the etching stop layer 131. Furthermore, various vias and short vias may couple different metal layers. For example, a via 129 may couple metal electrodes between the metal layer 122 and the metal layer 124, and a via 128 may couple metal electrodes between the metal layer 124 and the metal layer 126.

In embodiments, the vertical TFT 110 includes a gate electrode 105, a channel layer 109, a gate dielectric layer 107, and a drain electrode 121. In addition, the vertical TFT 110 further includes a spacer 108, where the gate electrode 105 is adjacent to the spacer 108 and the gate dielectric layer 107. The vertical TFT 110 may also include a metal sealant layer 112. In some embodiments, the gate electrode 105 is coupled to a wordline of a memory array and the drain electrode 121 is coupled to a bitline of the memory array.

In embodiments, the capacitor 120 includes a first plate 113, and a second plate 111 separated from the first plate 113 by a capacitor dielectric layer 115. The capacitor dielectric layer 115 may include a U-shaped portion. The first plate 113 of the capacitor 120 is also a source electrode of the vertical TFT 110, and is coupled with a portion of the channel layer 109 of the vertical TFT 110. The drain electrode 121 is located at a first side of the channel layer 109, and the first plate 113 of the capacitor 120 is located at a second side of the channel layer 109 opposite to the first side of the channel layer 109. In some embodiments, the first plate 113 of the capacitor 120 is coupled with the second portion of the channel layer 109 of the vertical TFT 110 through the metal sealant layer 112. The source electrode and the drain electrode may be interchangeable for the vertical TFT 110.

In embodiments, the drain electrode 121 includes a first metal electrode located in the metal layer 122, and a short via 123 coupled to the drain electrode 121 and to the first portion of the channel layer 109. The gate electrode 105 includes a second metal electrode located in the metal layer 124, where the metal layer 124 is separated from the metal layer 122 by the ILD layer 125. The second plate 111 of the capacitor 120 may be coupled to the via 128 between two adjacent metal layers, e.g., the metal layer 124 and the metal layer 126.

In embodiments, the substrate 101 may be oriented in a horizontal direction. The gate electrode 105 may be above the substrate 101, oriented in a vertical direction substantially orthogonal to the horizontal direction. In detail, the gate electrode 105 oriented in the vertical direction may mean that the gate electrode 105 is oriented in a vertical direction substantially perpendicular or orthogonal to the plane defined by the substrate 101 that is oriented in the horizontal direction. A first direction may be substantially perpendicular or orthogonal to a second direction when there is +/−10 degrees of orthogonality between the two directions. For example, the substrate 101 may be in the horizontal direction, while the gate electrode 105 may be oriented in a vertical direction above the substrate 101 when the gate electrode 105 may form an 80 degree or 100 degree with the horizontal direction. The gate dielectric layer 107 includes a gate dielectric material, and is oriented in the vertical direction, around the gate electrode 105. The gate dielectric layer 107 may be completely around the gate electrode 105, or partially around the gate electrode 105. The channel layer 109 includes a channel material, and is oriented in the vertical direction, around the gate dielectric layer 107, and above the substrate 101.

In embodiments, the drain electrode 121, the gate electrode 105, may have a width equal to a minimal feature width F for the memory cell 100. In addition, the memory cell 100 may be separated from another memory cell by a minimal feature width F. Accordingly, the memory cell 100 may occupy an area of $2F*2F=4F^2$. Other memory cells may occupy similar areas.

In embodiments, the gate electrode 105, the drain electrode 121, the first plate 113, or the second plate 111, may include titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, or an alloy of Ti, Mo, Au, Pt, Al, Ni, Cu, Cr, TiAlN, HfAlN, or InAlO.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103, the ILD layer 125, or the ILD layer 127, may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

FIG. 1(c) schematically illustrates two memory cells, e.g., a memory cell 150, and a memory cell 190 including a vertical TFT and a capacitor formed in BEOL on a substrate 151. The components of the memory cell 150 or the memory cell 190 may be similar to components of the memory cell 100.

In embodiments, the memory cell 150 includes a vertical TFT 160 and a capacitor 170 above the substrate 151, while the memory cell 190 includes a vertical TFT 191 and a capacitor 193 above the substrate 151. Furthermore, the memory cell 150 and the memory cell 190 include an ILD layer 153 above the substrate 151, an ILD layer 175 above the ILD layer 153, and an ILD layer 177 above the ILD layer 175. A metal layer 172, a metal layer 174, and a metal layer 176 are above the substrate 151, and separated by the ILD layers, e.g., the ILD layer 175, and the ILD layer 177. The ILD layer 153, the ILD layer 175, the ILD layer 177, the metal layer 172, the metal layer 174, and the metal layer 176 may be a part of an interconnect structure at BEOL on the substrate 151. An etching stop layer may be adjacent to a metal layer. For example, an etching stop layer 181 is adjacent to the metal layer 172, and an etching stop layer 183 is adjacent to the metal layer 174.

In embodiments, the vertical TFT 160 includes a gate electrode 155, a channel layer 159, a gate dielectric layer 157, and a drain electrode 171. In addition, the vertical TFT 160 further includes a spacer 158, where the gate electrode 155 is adjacent to the spacer 158 and the gate dielectric layer 157. The vertical TFT 160 may also include a metal sealant layer 162. In some embodiments, the gate electrode 155 is coupled to a wordline of a memory array and the drain electrode 171 is coupled to a bitline of the memory array.

The drain electrode 171 includes a first metal electrode located in the metal layer 172, and the short via 173 coupled to the drain electrode 171 and to the first portion of the channel layer 159. The gate electrode 155 includes a second metal electrode located in the metal layer 174, where the metal layer 174 is separated from the metal layer 172 by the ILD layer 175.

In embodiments, the vertical TFT 191 shares the gate electrode 155, the channel layer 159, the gate dielectric layer 157, and the spacer 158 with the vertical TFT 160. In some embodiments, the gate electrode 155, the channel layer 159, the gate dielectric layer 157, and the spacer 158 may be continuously shared at the wordline direction for the memory cell 150 and the memory cell 190, as shown in FIG. 1(c). In some other embodiments, there may be insulating areas to separate the layers of the vertical TFTs for the memory cell 150 and the memory cell 190. On the other hand, at the bitline direction, the layers of the vertical TFTs for the memory cell 150 and the memory cell 190, e.g., the gate electrode 155, the channel layer 159, the gate dielectric layer 157, and the spacer 158, may be separated by insulating areas between the vertical TFT 160 and the vertical TFT 191. In addition, the vertical TFT 191 includes a metal sealant layer 168, a drain electrode 182 coupled to the channel layer 159 through a short via 184.

In embodiments, the capacitor 170 includes a first plate 163, and a second plate 161 separated from the first plate 163 by a capacitor dielectric layer 165. The capacitor dielectric layer 165 may include a U-shaped portion. The second plate 161 of the capacitor 170 may be coupled to a via 178 between two adjacent metal layers, e.g., the metal layer 174 and the metal layer 176. The first plate 163 of the capacitor 170 is also a source electrode of the vertical TFT 160, and is coupled with a portion of the channel layer 159 of the vertical TFT 160. The drain electrode 171 is located at a first side of the channel layer 159, and the first plate 163 of the capacitor 170 is located at a second side of the channel layer 159 opposite to the first side of the channel layer 159. In some embodiments, the first plate 163 of the capacitor 170 is coupled with the second portion of the channel layer 159 through the metal sealant layer 162.

In embodiments, the capacitor 193 includes a first plate 164, and a second plate, which is shared with the second plate 161 of the capacitor 193. The second plate 161 is separated from the first plate 164 by a capacitor dielectric layer 166. The capacitor dielectric layer 166 may include a U-shaped portion. The first plate 164 of the capacitor 193 is also a source electrode of the vertical TFT 191, and is coupled with a portion of the channel layer 159 of the vertical TFT 191. The drain electrode 182 is located at a first side of the channel layer 159, and the first plate 164 of the capacitor 193 is located at a second side of the channel layer 159 opposite to the first side of the channel layer 159. In some embodiments, the first plate 164 of the capacitor 193 is coupled with the second portion of the channel layer 159 through the metal sealant layer 168.

Figure 2A:
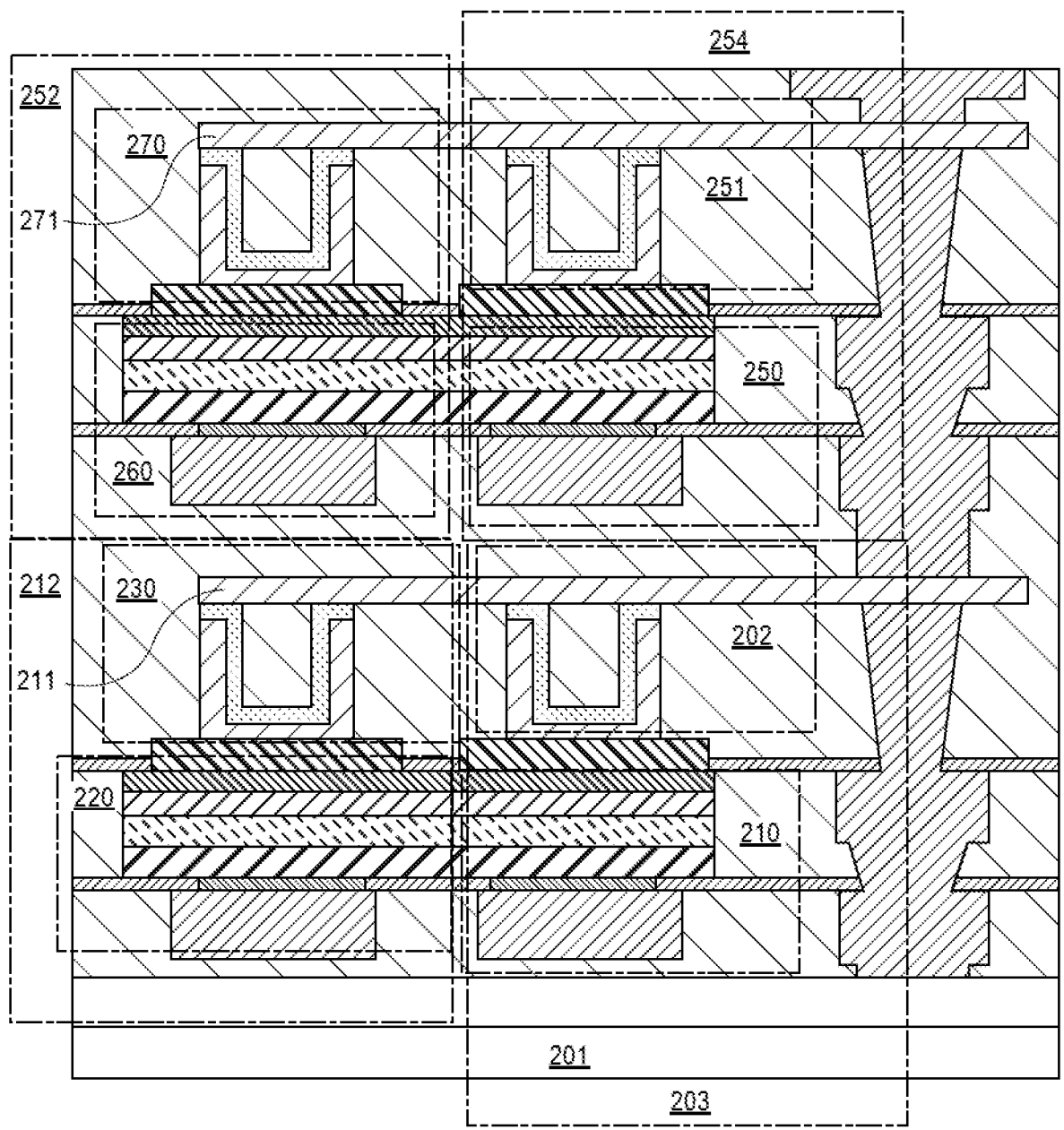

FIGS. 2(a)-2(b) schematically illustrate diagrams of a semiconductor device including multiple stacked memory cells having vertical TFTs and capacitors, in accordance with some embodiments. For example, a memory cell 252 may be stacked over a memory cell 212, a memory cell 254 may be stacked over a memory cell 203, a memory cell 284 may be stacked over a memory cell 236, and a memory cell 286 may be stacked over a memory cell 238.

The memory cell 252 includes a vertical TFT 260 and a capacitor 270, the memory cell 212 includes a vertical TFT 220 and a capacitor 230, the memory cell 254 includes a vertical TFT 250 and a capacitor 251, the memory cell 203 includes a vertical TFT 210 and a capacitor 202, the memory cell 284 includes a vertical TFT 280 and a capacitor 299, the memory cell 236 includes a vertical TFT 234 and a capacitor 240, the memory cell 238 includes a vertical TFT 241 and a capacitor 242, and the memory cell 286 includes a vertical TFT 281 and a capacitor 282. The vertical TFT 260, the vertical TFT 220, the vertical TFT 250, the vertical TFT 210, the vertical TFT 280, the vertical TFT 234, the vertical TFT 241, and the vertical TFT 281, may be similar to the vertical TFT 110 as shown in FIG. 1(*a*). The capacitor 270, the capacitor 230, the capacitor 251, the capacitor 202, the capacitor 299, the capacitor 240, the capacitor 242, and the capacitor 282 may be similar to the capacitor 120 as shown in FIG. 1(*a*).

As shown in FIG. 2(*a*), in embodiments, the vertical TFT 260 and the vertical TFT 250 may share a gate electrode, a channel layer in the wordline direction. The vertical TFT 220 and the vertical TFT 210 may share a gate electrode, a channel layer in the wordline direction In addition, the capacitor 230 and the capacitor 202 may share a plate 211. A bitline may be coupled to a drain electrode of the vertical TFT 260, the vertical TFT 220, the vertical TFT 250, and the vertical TFT 210, and may be coupled to a multiplexer to share a sense amplifier, which may be below or above the memory cells, e.g., the memory cell 252, the memory cell 212, the memory cell 254, and the memory cell 203.

As shown in FIG. 2(*b*), in embodiments, the vertical TFT 280 and the vertical TFT 281 may share a gate electrode, a channel layer in the wordline direction. The vertical TFT 234 and the vertical TFT 241 may share a gate electrode, a channel layer in the wordline direction In addition, the capacitor 299, the capacitor 240, the capacitor 242, and the capacitor 282 may share a plate 247. A bitline may be coupled to a drain electrode of the vertical TFT 280, the vertical TFT 281, the vertical TFT 234, and the vertical TFT 241, and may be coupled to a multiplexer to share a sense amplifier, which may be below or above the memory cells, e.g., the memory cell 284, the memory cell 236, the memory cell 238, and the memory cell 286.

Figure 3:
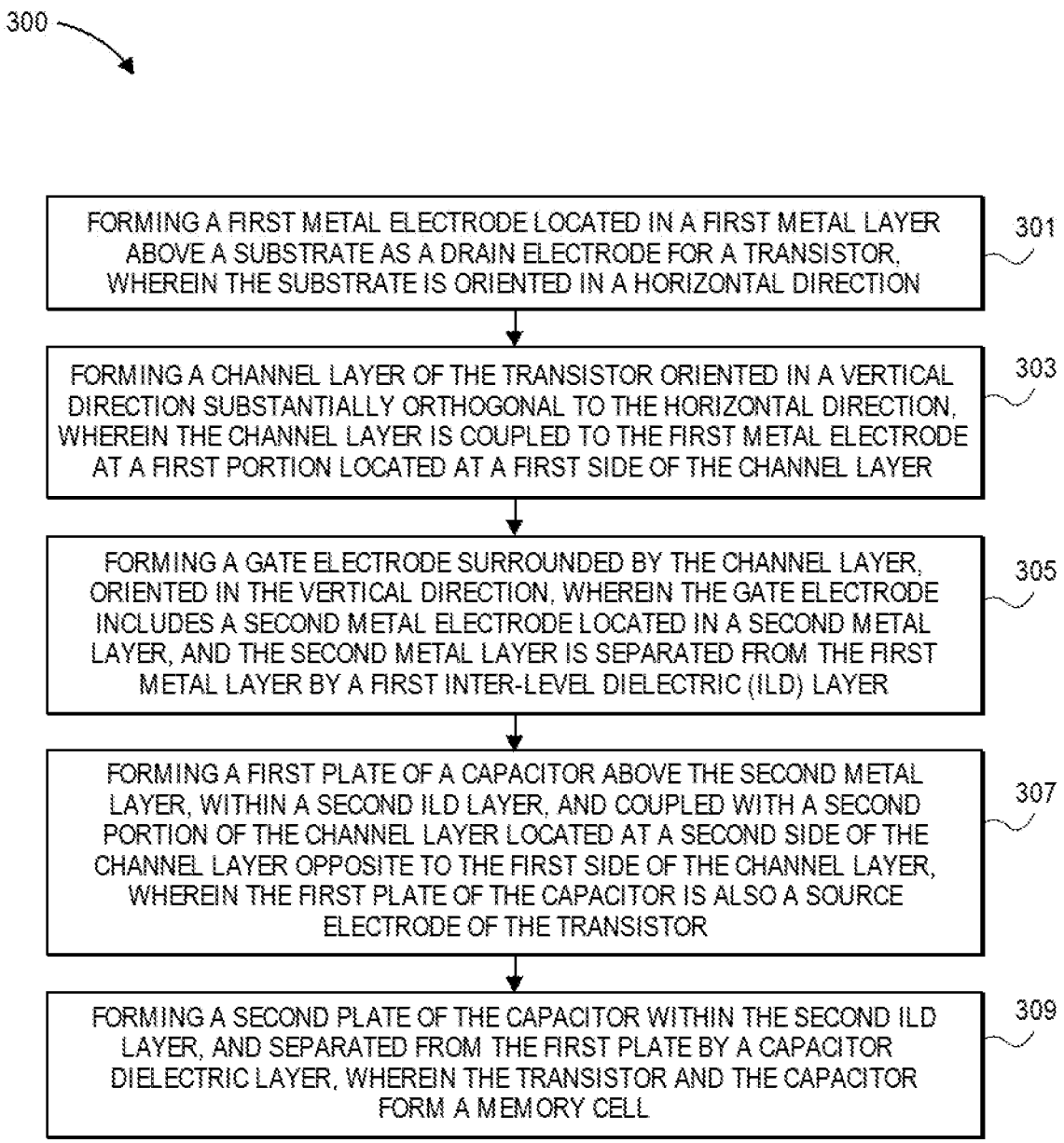
FIG. 3 illustrates a process for forming a memory cell including a vertical TFT and a capacitor, in accordance with some embodiments.

FIG. 3 illustrates a process 300 for forming a memory cell including a TFT and a capacitor with a shared contact electrode, in accordance with some embodiments. In embodiments, the process 300 may be applied to form the memory cell 100, the memory cell 150, and the memory cell 190, as shown in FIGS. 1(*a*)-1(*c*); the memory cell 252, the memory cell 212, the memory cell 254, the memory cell 203, the memory cell 284, the memory cell 236, the memory cell 286, and the memory cell 238, as shown in FIGS. 2(*a*)-2(*b*).

At block 301, the process 300 may include forming a first metal electrode located in a first metal layer above a substrate as a drain electrode for a transistor, wherein the substrate is oriented in a horizontal direction. For example, the process 300 may include forming a first metal electrode located in a first metal layer, e.g., the metal layer 122 above the substrate 101, as the drain electrode 121, where the substrate 101 is oriented in a horizontal direction, as shown in FIG. 1(*a*).

At block 303, the process 300 may include forming a channel layer of the transistor oriented in a vertical direction substantially orthogonal to the horizontal direction, wherein the channel layer is coupled to the first metal electrode at a first portion located at a first side of the channel layer. For example, the process 300 may include forming the channel layer 109 oriented in the vertical direction substantially orthogonal to the horizontal direction, where the channel layer 109 is coupled to the first metal electrode, e.g., the drain electrode 121, at a first portion located at a first side of the channel layer, as shown in FIG. 1(*a*).

At block 305, the process 300 may include forming a gate electrode surrounded by the channel layer, oriented in the vertical direction, wherein the gate electrode includes a second metal electrode located in a second metal layer, and the second metal layer is separated from the first metal layer by a first ILD layer. For example, the process 300 may include forming the gate electrode 105 surrounded by the channel layer 109, oriented in the vertical direction, where the gate electrode 109 includes a second metal electrode located in the metal layer 124, and the metal layer 124 is separated from the metal layer 122 by the ILD layer 125, as shown in FIG. 1(*a*).

At block 307, the process 300 may include forming a first plate of a capacitor above the second metal layer, within a second ILD layer, and coupled with a second portion of the channel layer located at a second side of the channel layer opposite to the first side of the channel layer, wherein the first plate of the capacitor is also a source electrode of the transistor. For example, the process 300 may include forming the first plate 113 of the capacitor 120 above the metal layer 124, within the ILD layer 127, and coupled with a second portion of the channel layer 109 located at a second side of the channel layer 109 opposite to the first side of the channel layer 109, wherein the first plate 113 of the capacitor 120 is also a source electrode, as shown in FIG. 1(*a*).

At block 309, the process 300 may include forming a second plate of the capacitor within the second ILD layer, and separated from the first plate by a capacitor dielectric layer, wherein the transistor and the capacitor form a memory cell. For example, the process 300 may include forming the second plate 111 of the capacitor 120 within the ILD layer 127, and separated from the first plate 113 by the capacitor dielectric layer 115, as shown in FIG. 1(*a*).

In addition, the process 300 may include additional operations to form other layers, e.g., ILD layers, encapsulation layers, insulation layers, not shown. For example, the process 300 may include forming a short via to couple the first metal electrode to the first portion of the channel layer, or forming a metal sealant layer, where the first plate of the capacitor is coupled with the second portion of the channel layer of the transistor through the metal sealant layer.

Furthermore, the process 300 may include stacked memory cells. For example, wherein the memory cell, the transistor, and the capacitor are a first memory cell, a first transistor, and a first capacitor respectively, and the method further includes forming a second memory cell above the first memory cell including a second transistor and a second capacitor, and the forming the second memory cell includes: forming a capacitor dielectric layer of the second capacitor adjacent to the second plate of the first capacitor, wherein the second plate of the first capacitor is also a second plate of the second capacitor; forming a first plate of the second capacitor adjacent to the capacitor dielectric layer of the second capacitor; wherein the first plate of the second capacitor, the second plate of the first capacitor are within the second ILD layer, and the first plate of the second capacitor is also a source electrode of the second transistor; forming a second channel layer of the second transistor oriented in the vertical direction, wherein the second channel layer is coupled to the first plate of the second capacitor at a first portion located at a first side of the second channel layer; forming a second gate electrode surrounded by the second channel layer, oriented in the vertical direction, wherein the second gate electrode includes a third metal electrode located in a third metal layer; and forming a fourth metal electrode located in a fourth metal layer above the third metal layer as a drain electrode for the second transistor, wherein the fourth metal layer is separated from the third metal layer by a third ILD layer, and coupled with a second portion located at a second side of the second channel layer opposite to the first side of the second channel layer.

Figure 4:
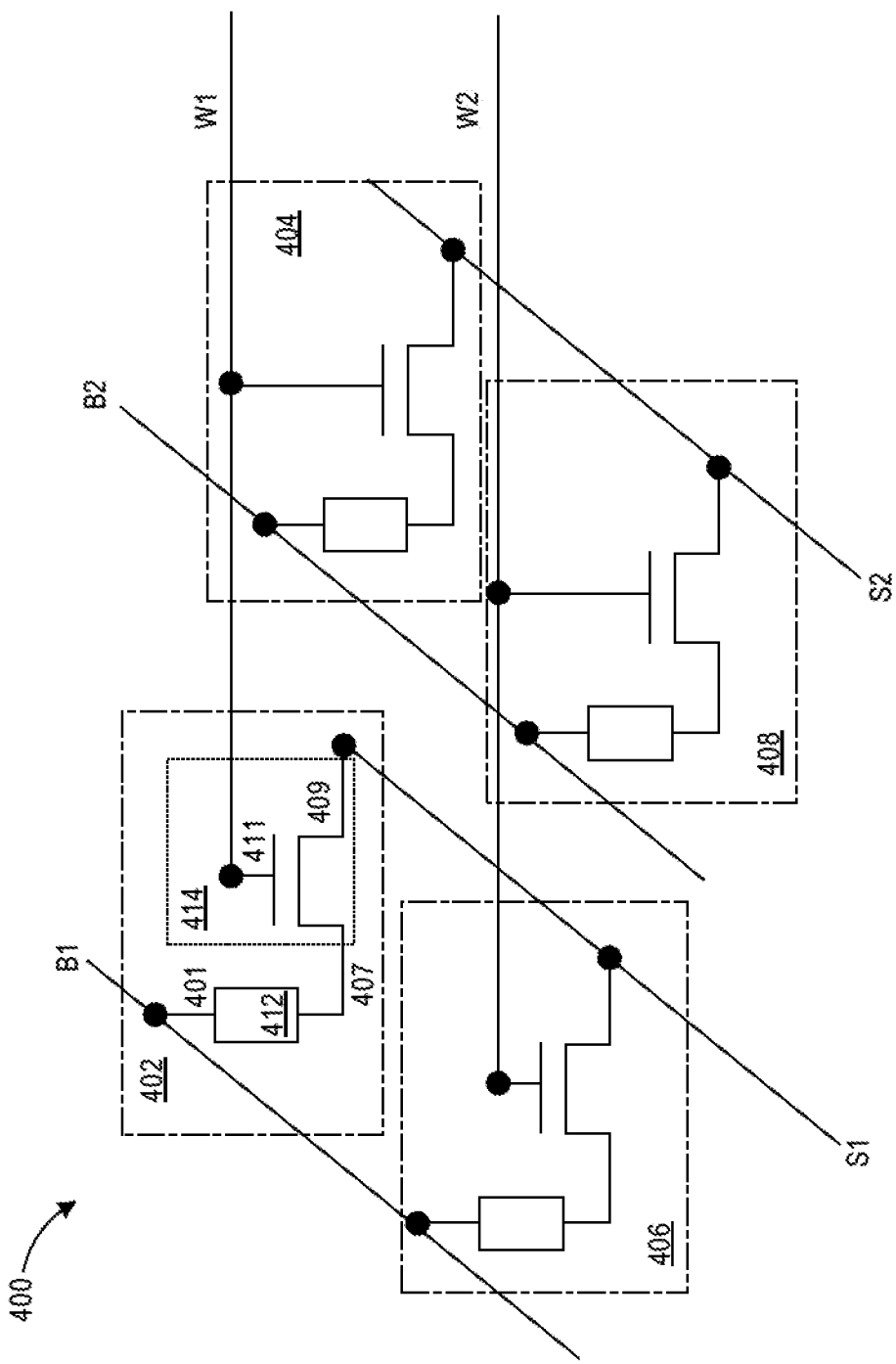
FIG. 4 schematically illustrates a memory array with multiple memory cells including a vertical TFT and a capacitor, in accordance with some embodiments.

FIG. 4 schematically illustrates a memory array 400 with multiple memory cells (e.g., a memory cell 402, a memory cell 404, a memory cell 406, and a memory cell 408), where a TFT, e.g., a TFT 414, may be a selector of a memory cell, e.g., the memory cell 402, in accordance with various embodiments. In embodiments, the memory cell 402, or other memory cells may be an example of the memory cell 100, the memory cell 150, and the memory cell 190, as shown in FIGS. 1(a)-1(c); the memory cell 252, the memory cell 212, the memory cell 254, the memory cell 203, the memory cell 284, the memory cell 236, the memory cell 286, and the memory cell 238, as shown in FIGS. 2(a)-2(b), or a memory cell formed following the process 300.

In embodiments, the multiple memory cells may be arranged in a number of rows and columns coupled by bitlines, e.g., bitline B1 and bitline B2, wordlines, e.g., wordline W1 and wordline W2, and source lines, e.g., source line Si and source line S2. The memory cell 402 may be coupled in series with the other memory cells of the same row, and may be coupled in parallel with the memory cells of the other rows. The memory array 400 may include any suitable number of one or more memory cells.

In embodiments, multiple memory cells, such as the memory cell 402, the memory cell 404, the memory cell 406, and the memory cell 408, may have a similar configuration. For example, the memory cell 402 may include the TFT 414 coupled to a storage cell 412 that may be a capacitor, which may be called a 1T1C configuration. The memory cell 402 may be controlled through multiple electrical connections to read from the memory cell, write to the memory cell, and/or perform other memory operations.

The TFT 414 may be a selector for the memory cell 402. A wordline W1 of the memory array 400 may be coupled to a gate electrode 411 of the TFT 414. When the wordline W1 is active, the TFT 414 may select the storage cell 412. A bitline B1 of the memory array 400 may be coupled to an electrode 401 of the storage cell 412, while another electrode 407 of the storage cell 412 may be shared with the TFT 414. In addition, a source line Si of the memory array 400 may be coupled to another electrode, e.g., an electrode 409 of the TFT 414. The shared electrode 407 may be a drain electrode of the TFT 414, while the electrode 409 may be a source electrode of the TFT 414. A drain electrode and a source electrode may be used interchangeably herein. Additionally, a source line and a bit line may be used interchangeably herein.

In some embodiments, for the memory array 400, e.g., an eDRAM memory array, multiple memory cells may have source lines or bitlines coupled together and have a constant voltage. In some embodiments, a common connection may be shared among all the rows and all the columns of the memory array 400. When such sharing occurs, the bitline and source line may not be interchangeable.

In various embodiments, the memory cells and the transistors, e.g., the memory cell 402 and the TFT 414, included in the memory array 400 may be formed in BEOL, as shown in FIG. 1. For example, the TFT 414 may be illustrated as the vertical TFT 110 shown in FIG. 1 at the BEOL, and the storage cell 412 may be the capacitor 120 shown in FIG. 1. Accordingly, the memory array 400 may be formed in higher metal layers, e.g., metal layer 3 and/or metal layer 4, of the integrated circuit above the active substrate region, and may not occupy the active substrate area that is occupied by conventional transistors or memory devices.

Figure 5:
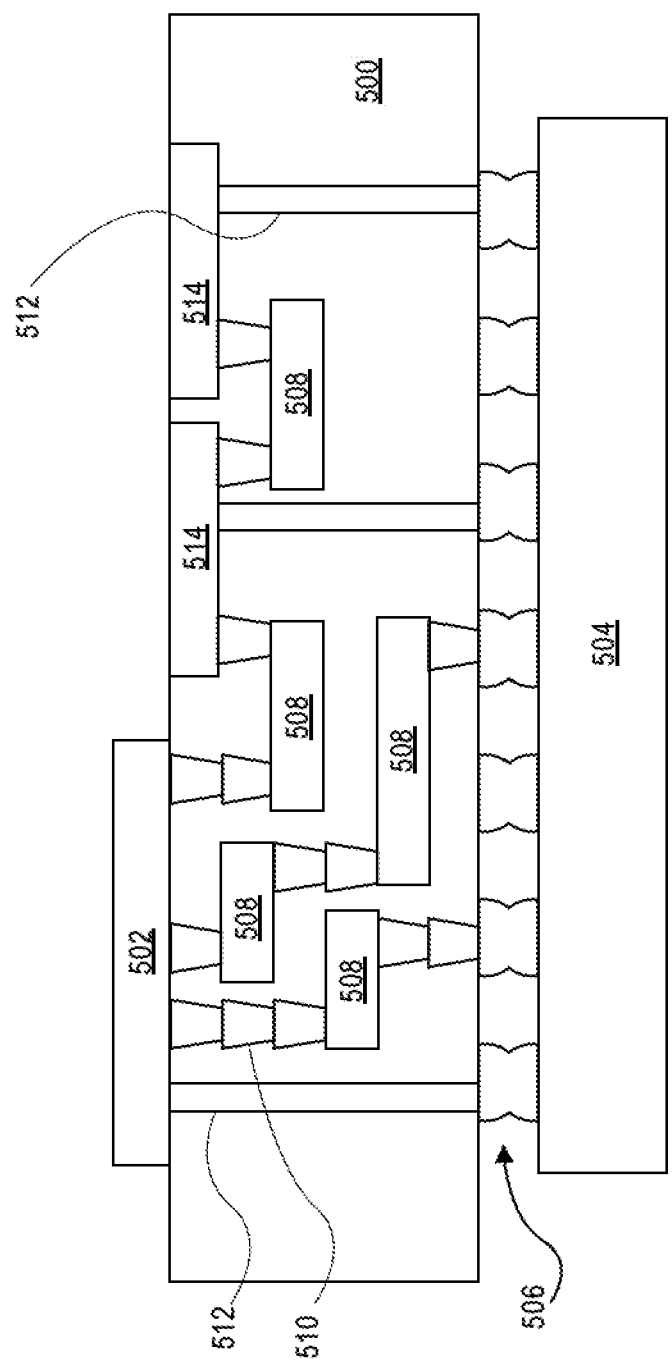
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a memory cell, e.g., the memory cell 100, the memory cell 150, and the memory cell 190, as shown in FIGS. 1(a)-1(c); the memory cell 252, the memory cell 212, the memory cell 254, the memory cell 203, the memory cell 284, the memory cell 236, the memory cell 286, and the memory cell 238, as shown in FIGS. 2(a)-2(b), or a memory cell formed following the process 300. The second substrate 504 may be, for instance, a memory module, a computer motherboard, or another integrated circuit die. For example, the second substrate 504 may be a memory module including the memory array 400 as shown in FIG. 4. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
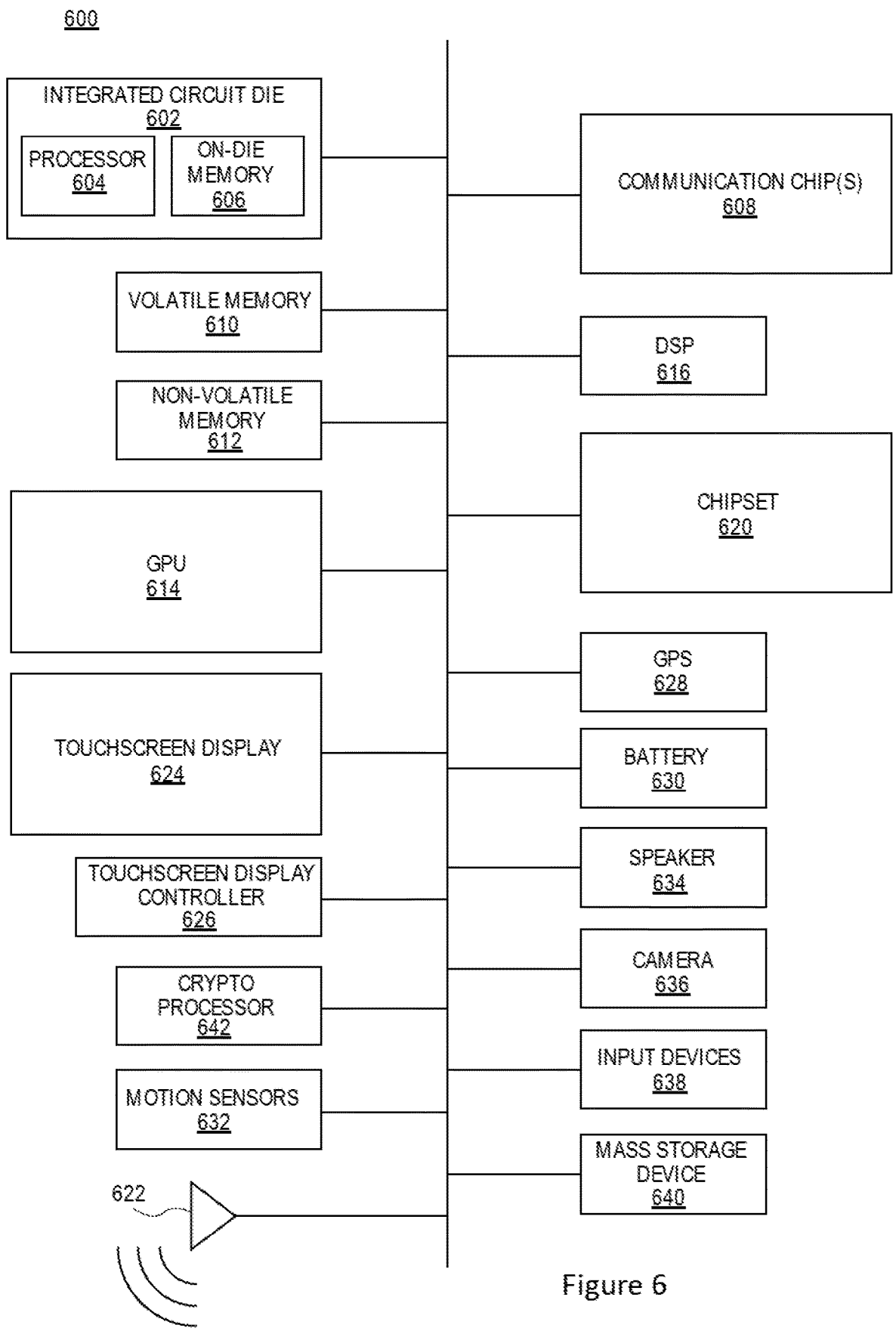
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include the memory cell 100, the memory cell 150, and the memory cell 190, as shown in FIGS. 1(*a*)-1(*c*); the memory cell 252, the memory cell 212, the memory cell 254, the memory cell 203, the memory cell 284, the memory cell 236, the memory cell 286, and the memory cell 238, as shown in FIGS. 2(*a*)-2(*b*), or a memory cell formed following the process 300.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the memory cell 100, the memory cell 150, and the memory cell 190, as shown in FIGS. 1(*a*)-1(*c*); the memory cell 252, the memory cell 212, the memory cell 254, the memory cell 203, the memory cell 284, the memory cell 236, the memory cell 286, and the memory cell 238, as shown in FIGS. 2(*a*)-2(*b*), or a memory cell formed following the process 300.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some Non-Limiting Examples are Provided Below.

Example 1 may include a semiconductor device, comprising: a substrate oriented in a horizontal direction; and a memory cell including a transistor above the substrate, and a capacitor within an inter-level dielectric (ILD) layer above the substrate; wherein the transistor includes: a gate electrode above the substrate, oriented in a vertical direction substantially orthogonal to the horizontal direction; a channel layer oriented in the vertical direction, around the gate electrode and separated by a gate dielectric layer from the gate electrode; and a drain electrode separated from the gate electrode, and in contact with a first portion of the channel layer; the capacitor includes a first plate coupled with a second portion of the channel layer of the transistor, and a second plate separated from the first plate by a capacitor dielectric layer; and the drain electrode is located at a first side of the channel layer, the first plate of the capacitor is located at a second side of the channel layer opposite to the first side of the channel layer, and the first plate of the capacitor is also a source electrode of the transistor.

Example 2 may include the semiconductor device of example 1 and/or some other examples herein, wherein the drain electrode includes a first metal electrode located in a first metal layer, and a short via coupled to the first metal electrode and to the first portion of the channel layer.

Example 3 may include the semiconductor device of example 2 and/or some other examples herein, wherein the gate electrode includes a second metal electrode located in a second metal layer, and the second metal layer is separated from the first metal layer by an ILD layer.

Example 4 may include the semiconductor device of example 2 and/or some other examples herein, wherein the short via is within or through an etching stop layer adjacent to the first metal layer.

Example 5 may include the semiconductor device of example 1 and/or some other examples herein, wherein the second plate of the capacitor is coupled with a via between two adjacent metal layers.

Example 6 may include the semiconductor device of example 1 and/or some other examples herein, wherein the transistor and the capacitor are within an interconnect structure that is above the substrate.

Example 7 may include the semiconductor device of example 1 and/or some other examples herein, wherein the transistor further includes: a spacer, wherein the gate electrode is adjacent to the spacer and the gate dielectric layer.

Example 8 may include the semiconductor device of example 1 and/or some other examples herein, wherein the transistor further includes: a metal sealant layer, wherein the first plate of the capacitor is coupled with the second portion of the channel layer of the transistor through the metal sealant layer.

Example 9 may include the semiconductor device of example 1 and/or some other examples herein, wherein the capacitor dielectric layer of the capacitor includes a U-shaped portion.

Example 10 may include the semiconductor device of example 1 and/or some other examples herein, wherein the gate electrode is coupled to a wordline of a memory array and the drain electrode is coupled to a bitline of the memory array.

Example 11 may include the semiconductor device of example 1 and/or some other examples herein, wherein the memory cell, the transistor, and the capacitor are a first memory cell of a memory array, a first transistor, and a first capacitor respectively, and the semiconductor device further includes a second memory cell above the first memory cell, wherein the second memory cell includes a second transistor and a second capacitor, the second transistor includes: a second gate electrode above the substrate, oriented in the vertical direction; a second channel layer oriented in the vertical direction, around the second gate electrode and separated by a gate dielectric layer from the second gate electrode; and a second drain electrode separated from the second gate electrode, and in contact with a first portion of the second channel layer; the second capacitor includes a first plate of the second capacitor coupled with a second portion of the second channel layer of the second transistor, and a second plate of the second capacitor separated from the first plate of the second capacitor by a capacitor dielectric layer; and the second drain electrode is located at a first side of the second channel layer, the first plate of the second capacitor is located at a second side of the second channel layer opposite to the first side of the second channel layer, and the first plate of the second capacitor is also a source electrode of the second transistor.

Example 12 may include the semiconductor device of example 11 and/or some other examples herein, wherein the second plate of the second capacitor is coupled to the second plate of the first capacitor by one or more vias.

Example 13 may include the semiconductor device of example 11 and/or some other examples herein, wherein the second plate of the second capacitor and the second plate of the first capacitor are one shared plate.

Example 14 may include the semiconductor device of example 11 and/or some other examples herein, wherein the first gate electrode of the first transistor is coupled to a first wordline of the memory array, the first drain electrode is coupled to a first bitline of the memory array; the second gate electrode of the second transistor is coupled to a second wordline of the memory array, the second drain electrode is coupled to a second bitline of the memory array; and the first bit line and the second bit line are coupled to a multiplexer to share a sense amplifier below the first memory cell and the second memory cell.

Example 15 may include a method for forming a semiconductor device, the method comprising: forming a first metal electrode located in a first metal layer above a substrate as a drain electrode for a transistor, wherein the substrate is oriented in a horizontal direction; forming a channel layer of the transistor oriented in a vertical direction substantially orthogonal to the horizontal direction, wherein the channel layer is coupled to the first metal electrode at a first portion located at a first side of the channel layer; forming a gate electrode surrounded by the channel layer, oriented in the vertical direction, wherein the gate electrode includes a second metal electrode located in a second metal layer, and the second metal layer is separated from the first metal layer by a first inter-level dielectric (ILD) layer; forming a first plate of a capacitor above the second metal layer, within a second ILD layer, and coupled with a second portion of the channel layer located at a second side of the channel layer opposite to the first side of the channel layer, wherein the first plate of the capacitor is also a source electrode of the transistor; and forming a second plate of the capacitor within the second ILD layer, and separated from the first plate by a capacitor dielectric layer, wherein the transistor and the capacitor form a memory cell.

Example 16 may include the method of example 15 and/or some other examples herein, further comprising: forming a short via to couple the first metal electrode to the first portion of the channel layer.

Example 17 may include the method of example 15 and/or some other examples herein, further comprising: forming a metal sealant layer, wherein the first plate of the capacitor is coupled with the second portion of the channel layer of the transistor through the metal sealant layer.

Example 18 may include the method of example 15 and/or some other examples herein, wherein the memory cell, the transistor, and the capacitor are a first memory cell, a first transistor, and a first capacitor respectively, and the method further includes forming a second memory cell above the first memory cell including a second transistor and a second capacitor, and the forming the second memory cell includes: forming a capacitor dielectric layer of the second capacitor adjacent to the second plate of the first capacitor, wherein the second plate of the first capacitor is also a second plate of the second capacitor; forming a first plate of the second capacitor adjacent to the capacitor dielectric layer of the second capacitor; wherein the first plate of the second capacitor, the second plate of the first capacitor are within the second ILD layer, and the first plate of the second capacitor is also a source electrode of the second transistor; forming a second channel layer of the second transistor oriented in the vertical direction, wherein the second channel layer is coupled to the first plate of the second capacitor at a first portion located at a first side of the second channel layer; forming a second gate electrode surrounded by the second channel layer, oriented in the vertical direction, wherein the second gate electrode includes a third metal electrode located in a third metal layer; and forming a fourth metal electrode located in a fourth metal layer above the third metal layer as a drain electrode for the second transistor, wherein the fourth metal layer is separated from the third metal layer by a third ILD layer, and coupled with a second portion located at a second side of the second channel layer opposite to the first side of the second channel layer.

Example 19 may include a computing device, comprising: a circuit board; and a memory device coupled to the circuit board and including a memory array, wherein the memory array includes a plurality of memory cells, a memory cell of the plurality of memory cells includes a transistor above a substrate oriented in a horizontal direction, and a capacitor within an inter-level dielectric (ILD) layer above the substrate; wherein the transistor includes: a gate electrode above the substrate, oriented in a vertical direction substantially orthogonal to the horizontal direction; a channel layer oriented in the vertical direction, around the gate electrode and separated by a gate dielectric layer from the gate electrode; and a drain electrode separated from the gate electrode, and in contact with a first portion of the channel layer; the capacitor includes a first plate coupled with a second portion of the channel layer of the transistor, and a second plate separated from the first plate by a capacitor dielectric layer; and the drain electrode is located at a first side of the channel layer, the first plate of the capacitor is located at a second side of the channel layer opposite to the first side of the channel layer, and the first plate of the capacitor is also a source electrode of the transistor.

Example 20 may include computing device of example 19 and/or some other examples herein, wherein the substrate includes a material selected from the group consisting of a silicon substrate, a glass substrate, a metal substrate, and a plastic substrate.

Example 21 may include computing device of example 19 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 22 may include computing device of example 19 and/or some other examples herein, wherein the gate electrode, the drain electrode, the first plate, or the second plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 23 may include computing device of example 19 and/or some other examples herein, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 24 may include computing device of example 19 and/or some other examples herein, wherein the drain electrode includes a first metal electrode located in a first metal layer, and a short via coupled to the first metal electrode and to the first portion of the channel layer; the gate electrode includes a second metal electrode located in a second metal layer, and the second metal layer is separated from the first metal layer by an ILD layer; and the short via is within or through an etching stop layer adjacent to the first metal layer.

Example 25 may include computing device of example 19 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
    a substrate oriented in a horizontal direction; and
    a memory cell including a transistor above the substrate, and a capacitor within an inter-level dielectric (ILD) layer above the substrate;
    wherein the transistor includes:
        a gate electrode above the substrate, oriented in a vertical direction substantially orthogonal to the horizontal direction;
        a channel layer oriented in the vertical direction, around the gate electrode and separated by a gate dielectric layer from the gate electrode; and
        a drain electrode separated from the gate electrode, and in contact with a first portion of the channel layer;
    the capacitor includes a first plate coupled with a second portion of the channel layer of the transistor, and a second plate separated from the first plate by a capacitor dielectric layer; and the drain electrode is located at a first side of the channel layer, the first plate of the capacitor is located at a second side of the channel layer opposite to the first side of the channel layer, and the first plate of the capacitor is also a source electrode of the transistor.

2. The semiconductor device of claim 1, wherein the drain electrode includes a first metal electrode located in a first metal layer, and a short via coupled to the first metal electrode and to the first portion of the channel layer.

3. The semiconductor device of claim 2, wherein the gate electrode includes a second metal electrode located in a second metal layer, and the second metal layer is separated from the first metal layer by an ILD layer.

4. The semiconductor device of claim 2, wherein the short via is within or through an etching stop layer adjacent to the first metal layer.

5. The semiconductor device of claim 1, wherein the second plate of the capacitor is coupled with a via between two adjacent metal layers.

6. The semiconductor device of claim 1, wherein the transistor and the capacitor are within an interconnect structure that is above the substrate.

7. The semiconductor device of claim 1, wherein the transistor further includes:
a spacer, wherein the gate electrode is adjacent to the spacer and the gate dielectric layer.

8. The semiconductor device of claim 1, wherein the transistor further includes:
a metal sealant layer, wherein the first plate of the capacitor is coupled with the second portion of the channel layer of the transistor through the metal sealant layer.

9. The semiconductor device of claim 1, wherein the capacitor dielectric layer of the capacitor includes a U-shaped portion.

10. The semiconductor device of claim 1, wherein the gate electrode is coupled to a wordline of a memory array and the drain electrode is coupled to a bitline of the memory array.

11. The semiconductor device of claim 1, wherein the memory cell, the transistor, and the capacitor are a first memory cell of a memory array, a first transistor, and a first capacitor respectively, and the semiconductor device further includes a second memory cell above the first memory cell, wherein the second memory cell includes a second transistor and a second capacitor,
the second transistor includes:
a second gate electrode above the substrate, oriented in the vertical direction;
a second channel layer oriented in the vertical direction, around the second gate electrode and separated by a gate dielectric layer from the second gate electrode; and
a second drain electrode separated from the second gate electrode, and in contact with a first portion of the second channel layer;
the second capacitor includes a first plate of the second capacitor coupled with a second portion of the second channel layer of the second transistor, and a second plate of the second capacitor separated from the first plate of the second capacitor by a capacitor dielectric layer; and
the second drain electrode is located at a first side of the second channel layer, the first plate of the second capacitor is located at a second side of the second channel layer opposite to the first side of the second channel layer, and the first plate of the second capacitor is also a source electrode of the second transistor.

12. The semiconductor device of claim 11, wherein the second plate of the second capacitor is coupled to the second plate of the first capacitor by one or more vias.

13. The semiconductor device of claim 11, wherein the second plate of the second capacitor and the second plate of the first capacitor are one shared plate.

14. The semiconductor device of claim 11, wherein the first gate electrode of the first transistor is coupled to a first wordline of the memory array, the first drain electrode is coupled to a first bitline of the memory array;
the second gate electrode of the second transistor is coupled to a second wordline of the memory array, the second drain electrode is coupled to a second bitline of the memory array; and
the first bit line and the second bit line are coupled to a multiplexer to share a sense amplifier below the first memory cell and the second memory cell.

15. A computing device, comprising:
a circuit board; and
a memory device coupled to the circuit board and including a memory array, wherein the memory array includes a plurality of memory cells, a memory cell of the plurality of memory cells includes a transistor above a substrate oriented in a horizontal direction, and a capacitor within an inter-level dielectric (ILD) layer above the substrate;
wherein the transistor includes:
a gate electrode above the substrate, oriented in a vertical direction substantially orthogonal to the horizontal direction;
a channel layer oriented in the vertical direction, around the gate electrode and separated by a gate dielectric layer from the gate electrode; and
a drain electrode separated from the gate electrode, and in contact with a first portion of the channel layer;
the capacitor includes a first plate coupled with a second portion of the channel layer of the transistor, and a second plate separated from the first plate by a capacitor dielectric layer; and
the drain electrode is located at a first side of the channel layer, the first plate of the capacitor is located at a second side of the channel layer opposite to the first side of the channel layer, and the first plate of the capacitor is also a source electrode of the transistor.

16. The computing device of claim 15, wherein the substrate includes a material selected from the group consisting of a silicon substrate, a glass substrate, a metal substrate, and a plastic substrate.

17. The computing device of claim 15, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

18. The computing device of claim 15, wherein the gate electrode, the drain electrode, the first plate, or the second plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

19. The computing device of claim 15, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

20. The computing device of claim 15, wherein the drain electrode includes a first metal electrode located in a first metal layer, and a short via coupled to the first metal electrode and to the first portion of the channel layer;

the gate electrode includes a second metal electrode located in a second metal layer, and the second metal layer is separated from the first metal layer by an ILD layer; and the short via is within or through an etching stop layer adjacent to the first metal layer.

21. The computing device of claim 15, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *